United States Patent
Anderson

(10) Patent No.: US 6,738,693 B2
(45) Date of Patent: May 18, 2004

(54) MULTIPLE VIRTUAL METERS IN ONE PHYSICAL METER

(75) Inventor: Larry W. Anderson, Charlotte, NC (US)

(73) Assignee: Landis+Gyr Inc., Lafayette, IN (US)

( * ) Notice: Subject to any disclaimer, the term of this patent is extended or adjusted under 35 U.S.C. 154(b) by 217 days.

(21) Appl. No.: 09/742,776

(22) Filed: Dec. 20, 2000

(65) Prior Publication Data

US 2002/0077729 A1 Jun. 20, 2002

(51) Int. Cl.[7] ............................................. G05D 11/00
(52) U.S. Cl. ............................. 700/291; 702/61; 705/63
(58) Field of Search ................................. 700/291, 295; 702/57, 61–62; 324/113–116; 705/63

(56) References Cited

U.S. PATENT DOCUMENTS

| | | | |
|---|---|---|---|
| 4,254,375 A | | 3/1981 | Matsuoka |
| 4,283,772 A | | 8/1981 | Johnston |
| 4,465,970 A | | 8/1984 | DiMassimo et al. |
| 4,542,469 A | | 9/1985 | Brandyberry et al. |
| 5,315,235 A | | 5/1994 | Atherton et al. |
| 5,587,917 A | | 12/1996 | Elms |
| 5,715,390 A | * | 2/1998 | Hoffman et al. ............. 713/202 |
| 5,742,512 A | * | 4/1998 | Edge et al. .................... 702/57 |
| 5,831,428 A | * | 11/1998 | Pyle et al. ................... 324/142 |
| 5,924,051 A | * | 7/1999 | Provost et al. ............... 702/61 |
| 5,933,092 A | * | 8/1999 | Ouellette et al. ......... 340/870.02 |
| 5,974,369 A | * | 10/1999 | Radtke et al. ............... 702/199 |
| 6,112,158 A | * | 8/2000 | Bond et al. ................... 702/61 |
| 6,483,290 B1 | * | 11/2002 | Hemminger et al. ........ 324/142 |
| 6,501,257 B1 | * | 12/2002 | Elmore ......................... 324/74 |
| 6,504,357 B1 | * | 1/2003 | Hemminger et al. ........ 324/142 |
| 6,564,159 B1 | * | 5/2003 | Lavoie et al. ................. 702/62 |

* cited by examiner

*Primary Examiner*—Leo Picard
*Assistant Examiner*—Alexander Kosowski
(74) *Attorney, Agent, or Firm*—Maginot, Moore & Beck

(57) ABSTRACT

A utility meter which provides multiple concurrent registering of commodity consumption data includes a source of commodity consumption signals, a measurement circuit, and a registering circuit. The source of commodity consumption signals is coupled to provide commodity consumption signals to the measurement circuit. The measurement circuit is operable to generate commodity consumption data from the commodity consumption signals. The register circuit is operably coupled to the measurement circuit to receive the commodity consumption data therefrom. To this end, the register circuit includes a memory and a processor. The memory stores a first set of parameters corresponding to a first metering mode, and a second set of parameters corresponding to a second metering mode. The processor is operable to generate first metering information by performing a metering routine a first time using the first set of parameters and the commodity consumption data, generate second metering information by performing the metering routine a second time using the second set of parameters and the commodity consumption data, such that the processor generates the first metering information and the second metering information on a concurrent basis.

12 Claims, 5 Drawing Sheets

MULTIPLE VIRTUAL METERS IN ONE PHYSICAL METER

FIELD OF THE INVENTION

The present invention relates generally to utility meters, and more particularly, to utility meters having the flexibility to perform various different types of metering functions for the consumption of a particular commodity.

BACKGROUND OF THE INVENTION

Utility meters are devices that, among other things, measure the consumption of a utility provided commodity, such as electric energy, gas, or water, by a residence, factory, commercial establishment or other such facility. Utility service providers employ utility meters to track individual customers' usage of utility provided commodities. Utilities track customer usage for many purposes, including billing and tracking demand for the relevant consumed commodity.

The basic operations of a utility meter can be viewed as logically composed of measuring operations and registering operations. The measuring operations convert commodity consumption signals that are provided by sensors coupled to the commodity being metered (such as, for example, electrical energy) into basic commodity consumption data (such as, for example, watthours, volts and amperes) which is indicative of a utility customer's commodity consumption. The registering operations process the commodity consumption data into particular billing and/or diagnostics formats ("metering information") which can be used by the utility and the customer.

A particular set of registering operations for a utility meter may be thought of as a particular "operating mode" or "metering mode" for the meter. For example, one set of registering operations typically includes reducing the commodity consumption data into a time-of-use format, while another set typically presents the data in a demand-type format. In these cases, the utility meter could be thought of as operating in either the time-of-use "mode" or the demand "mode," respectively.

Historically, a utility meter's operating mode was fixed in electromechanical hardware, such as an arrangement of rotating disks, driven by signals produced in the measurement circuits of the meter. The typical electromechanical register required markings on its electromechanical hardware which provided a visual readout of commodity consumption data in the format of the desired metering mode. For example, a meter which was set up to operate in the time-of-use mode could include as many as twenty-four different rotating disks, one for cumulatively registering the customer's commodity consumption during each of the twenty-four hours of the day over a given period of days.

Early electromechanical registers were integrated parts of the overall meter assembly, which made reconfiguration of a meter from one operating mode to another undesirably costly and wasteful. Moreover, in general, all electromechanical registers require utility providers to employ field technicians, or "meter-readers," to visit customers' facilities and visually read the commodity consumption data from the registers.

An advance in the art was replacement of the integrated electromechanical registering arrangements with removable, modular electromechanical registers. The modular electromechanical registers provided meters that were somewhat more "convertible." That is, the operating mode of such a meter could be changed by removing one electromechanical register and substituting a different one which was capable of performing the newly desired operations. For example, a demand-only register could be removed and replaced with a time-of-use register. An example of a removable modular electromechanical register is set forth in U.S. Pat. No. 5,014,213 to Edwards, et al. Modular electromechanical registers reduced the costs and waste associated with reconfiguring meters to operate in different modes.

A further advance in the art was the development of fully electronic registers. These electronic registers employ electronic hardware, such as solid-state devices and memory circuits, to register commodity consumption data without any moving parts. As a result, electronic registers provide increased accuracy and lower life cycle costs as compared to electromechanical registers, while maintaining the feature of removability.

With regard to the ability to alter a meter's operating mode, the electronic register allows alteration of metering parameters and operations within the meter by merely reprogramming the register. As discussed above, meters may be configured to measure energy consumption in several ways, including using the total energy consumed, recording the highest demand over a certain interval, or by multiplying the energy consumed by a factor determined by the time of day. Moreover, meters may be configured to track voltage, current, power factor (a measure of the phase angle difference between voltage and current) and other parameters. The electronic register allows a meter configured to track energy in one manner to be reprogrammed or reconfigured to track energy in a different manner.

Such capabilities are particularly useful as customers have more opportunity to choose between multiple utility providers. As competition in the utility service provider industry opens up due to deregulation, customers will have greater flexibility to select among both utility providers and the way energy consumption is measured. As a result, meters may require changes in functionality with a much greater frequency than in the past.

One example of an electronic register that may be converted between various modes of metering is shown in U.S. Pat. No. 5,315,235 to Atherton et al. ("Atherton"). Atherton shows an energy meter having a table driven operating system utilized in register component applications. The operating system coordinates the task execution sequence and priority of major tasks to be executed by the register component. The tables are a form of indirect addressing to respective software routines which control operation of the register component to perform respective tasks in a predetermined order. A different set of tasks are executed by changing the operating mode of the operating system. Thus, Atherton shows a meter that can be converted from one operating mode to another without interchanging either an electromechanical module or an electronic module.

One potential scenario that Atherton does not address is one in which multiple parties desire energy consumption data in different formats. In particular, due to the relatively high economic and ecological cost of electricity consumption, it is often desirable for non-utility parties to monitor the customer's energy usage. Such information may be used to optimize energy usage by the customer. For example, customers may analyze their energy consumption data to determine how to schedule certain operations in a manner that decrease energy costs.

To accomplish this task, customers have historically employed separate meters. In particular, customers and/or other parties analyzing energy usage often employed separate power monitor devices in addition to the utility's meter. Such power monitoring devices have significant cost, and require additional access to the power lines, and further occupy a significant amount of space in the customer's facility.

Indeed, with deregulation of the electricity utility service providers, it is more likely that multiple parties would desire the ability to track electricity consumption of a single establishment. Such parties may include electricity suppliers, electricity brokers, consultants and consumers. Each party would preferably have the ability to configure the meter in its own desired way.

Accordingly, there is a need for a utility meter that allows multiple parties to obtain energy consumption data regarding a facility without incurring the equipment, space, and convenience costs associated with the installation of a separate power monitor.

SUMMARY OF THE INVENTION

The present invention fulfills the above needs, as well as others, by providing multiple virtual meters in a single meter. More particularly, the present invention provides multiple virtual registering operations which are logically connected to a single measuring operation. To this end, the meter according to the present invention includes a processor that generates, contemporaneously, first metering information using a first set of parameters and second metering information using a second set of parameters. Thus, for example, a utility service provider may define a first set of parameters to carry out its preferred revenue metering operations while the customer may define the second set of parameters to carry out its preferred power monitoring/metering operations. Both sets of operations preferably use the same measurement data. In this manner, multiple users may perform custom metering operations on the same physical meter using the same measurement data.

In accordance with one embodiment of the present invention, a utility meter which provides multiple concurrent registering of commodity consumption data includes a source of commodity consumption signals, a measurement circuit, and a registering circuit. The source of commodity consumption signals is coupled to provide commodity consumption signals to the measurement circuit. The measurement circuit is operable to generate commodity consumption data from the commodity consumption signals. The register circuit is operably coupled to the measurement circuit to receive the commodity consumption data therefrom. To this end, the register circuit includes a memory and a processor. The memory stores a first set of parameters corresponding to a first metering mode, and a second set of parameters corresponding to a second metering mode. The processor is operable to generate first metering information by performing a metering routine a first time using the first set of parameters and the commodity consumption data, generate second metering information by performing the metering routine a second time using the second set of parameters and the commodity consumption data, such that the processor generates the first metering information and the second metering information on a concurrent basis.

The above discussed features and advantages, as well as others, may be readily ascertained by those of ordinary skill in the art by reference to the following detailed description and accompanying drawings.

DETAILED DESCRIPTION

Figure 1:
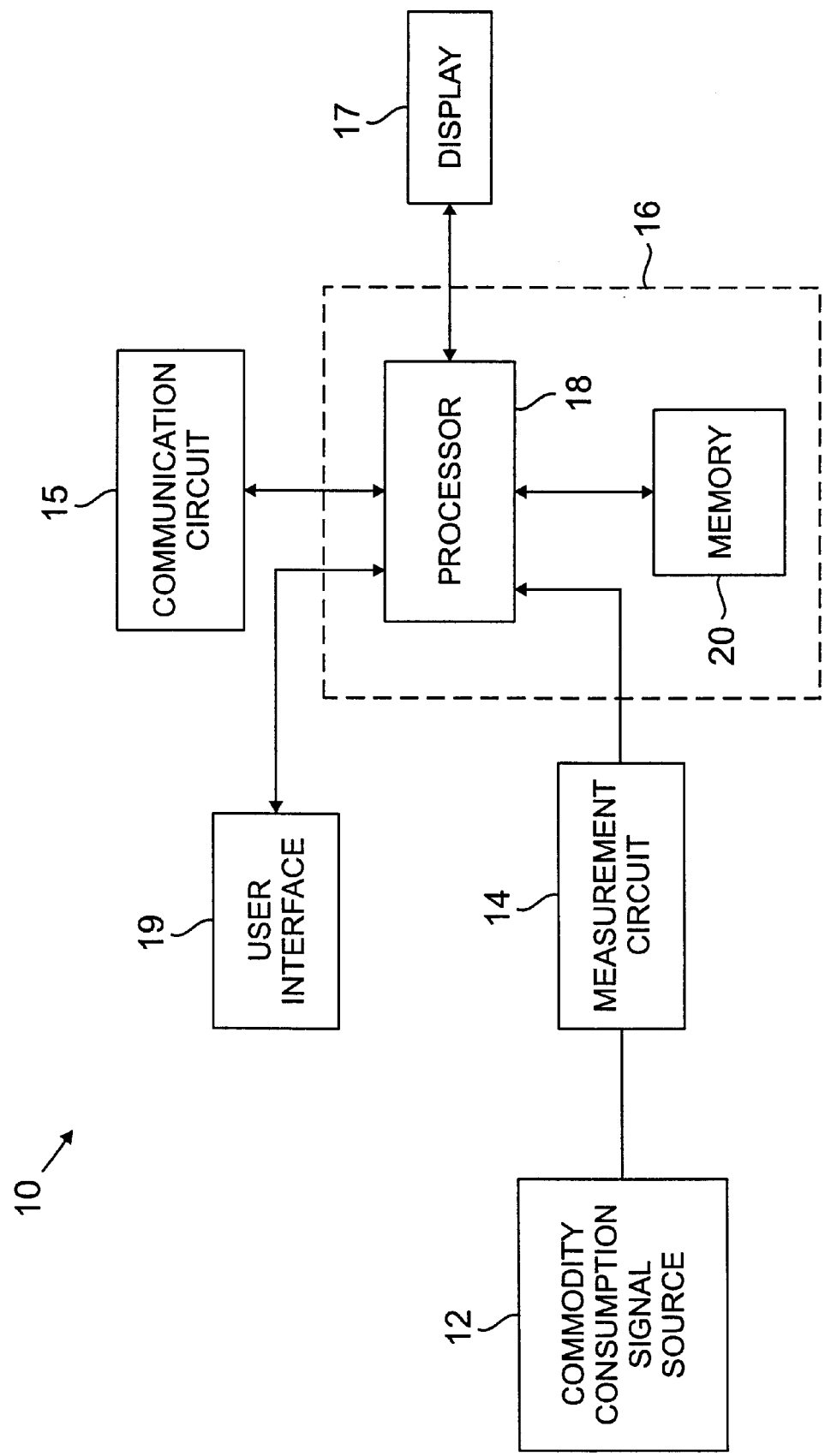
FIG. 1 shows a schematic block diagram of an exemplary utility meter 10 in accordance with the present invention.

FIG. 1 shows a schematic block diagram of an exemplary utility meter 10 in accordance with the present invention. The utility meter 10 provides multiple concurrent registering of commodity consumption data as discussed below. The utility meter 10 includes a source of commodity consumption signals 12, a measurement circuit 14, and a register circuit 16. In the exemplary embodiment described herein, the utility meter 10 further includes a communication circuit 15 and a display 17.

The source of commodity consumption signals 12 comprises one or more sensor devices that are capable of measuring the flow of a commodity into a facility, business, residence of the like. For example, if the utility meter 10 is an electricity meter, then the source of commodity consumption signals 12 may suitably comprise voltage and current sensors that are coupled to the power lines. Such sensors, which are well known in the art, generate a signal that is representative of the voltage and current waveforms on the power lines that provide electrical power to the relevant facility. If, however, the utility meter 10 is a gas or water meter, then the source of commodity consumption signals may suitably be a flow meter type of apparatus that generates an electrical signal that is representative of the volumetric flow of gas or water into the facility. Such devices are well known.

In the exemplary embodiment herein, the source of commodity consumption signals are voltage and current sensors such as those disclosed in U.S. patent application Ser. No. 09/227,434, filed Jan. 8, 1999, which is assigned to the assignee of the present invention and incorporated herein by reference.

The measurement circuit 14 is operably coupled to the source of commodity consumption signals 12 to receive the commodity consumption signals therefrom. The measurement circuit 14 is operable to generate commodity consumption data from the commodity consumption signals. The commodity consumption data is digital data that is representative of the measured commodity consumption. For example, in electricity meters, the measurement circuit 14 often provides energy and/or power consumption in terms of real power (watts), apparent power (volt-amps) and reactive power (VARs), and energy-related values including volts, amps, power factor. To this end, the measurement circuit 14 may include a digital signal processor or other digital circuitry that is capable of converting the commodity consumption signals into the consumption data.

In the exemplary embodiment described herein, the measurement circuit 14 is the digital signal processor circuit 45 of FIGS. 5A and 5B of U.S. patent application Ser. No. 09/227,434. The measurement circuit 14 of the exemplary embodiment described herein provides commodity consumption data approximately every second. The commodity consumption data includes values representative of the real energy consumed over the previous second, the volts-squared for the previous second, the amps-squared for the previous second, as well as other values.

Figure 2:
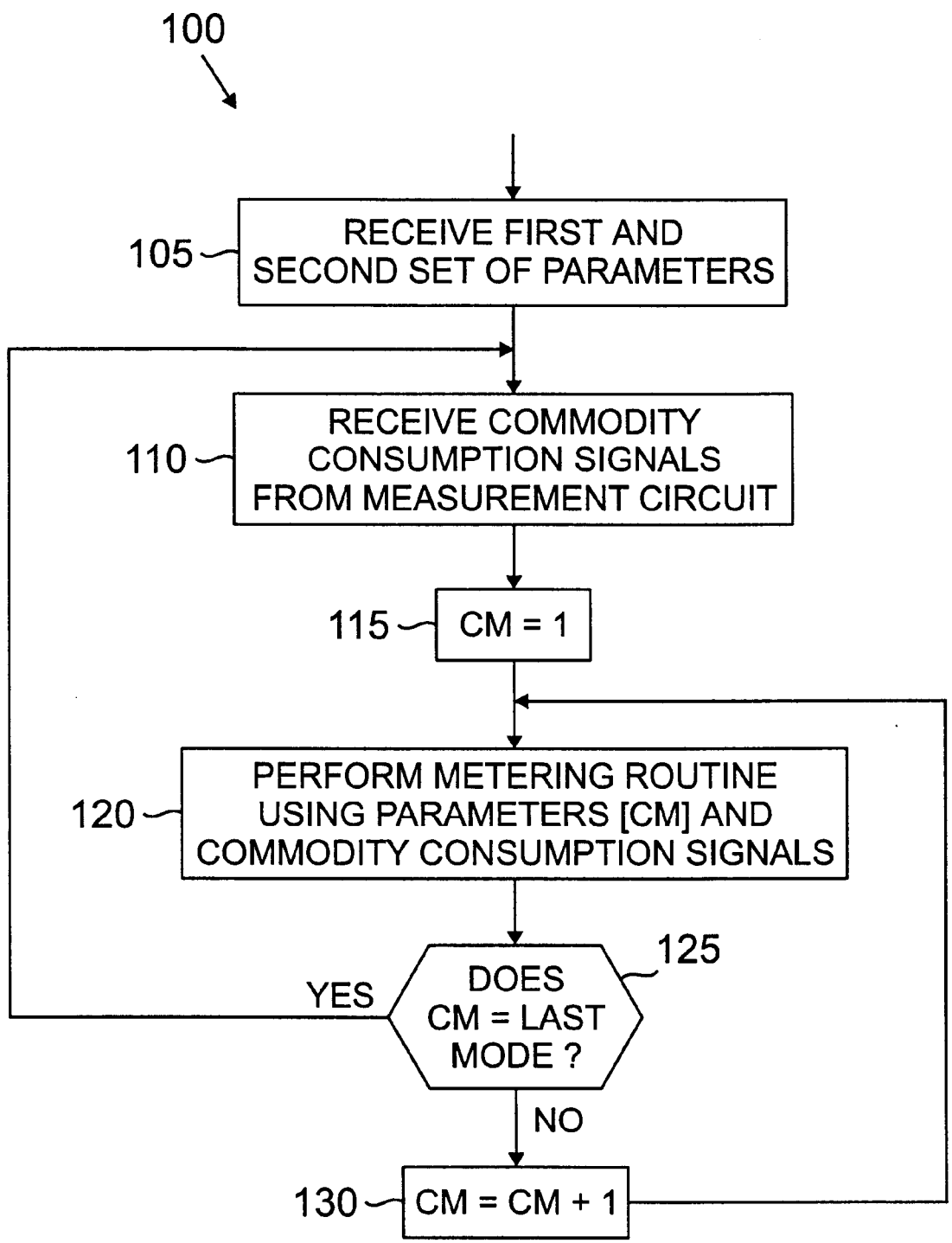
FIG. 2 shows a flow diagram of an exemplary set of operations carried out by a processor of a meter according to the present invention.

However, an exemplary alternative measurement circuit includes the conversion circuit 106 of FIG. 2 of U.S. Pat. No.

6,112,158 to Bond et al., which is incorporated herein by reference and assigned to the assignee of the present invention. Likewise, the processor circuit 14 of FIGS. 1 and 2 of U.S. Pat. No. 5,544,089, which also incorporated herein by reference, describes another suitable example of a measurement circuit for an electricity meter.

The register circuit 16 is operably coupled to the measurement circuit 14 to receive the commodity consumption data therefrom. The register circuit 16 is a circuit that further processes the commodity consumption data to generate and typically communicate various metering values. The metering values include a total count representative of energy consumed. The metering values may also include average voltage, current, power, or power factor for a defined period. The register circuit 16 also carries out specialized meter processing, such as determining demand intervals, time-of-use metering values, and alarm threshold comparisons.

To this end, the register circuit 16 includes a processor 18 and a memory 20. By way of example, the processor 18 may comprise the microprocessor 48 shown in U.S. patent application Ser. No. 09/227,434, the microcontroller 108 shown in U.S. Pat. No. 6,112,158, FIG. 2, or the microcontroller 16 shown in U.S. Pat. No. 5,537,029, FIG. 1.

While the exemplary embodiments described above employ a digital signal processor or the like as the processor of the measurement circuit 14 and a microprocessor or microcontroller as the processor of the register circuit 16, it will be appreciated that the measurement circuit 14 and the register circuit 16 represent functional blocks of the utility meter 10 and do not require any specific physical embodiment to benefit from the advantages of the present invention. For example, a single processor may execute the processing functions of both the measurement circuit 14 and the register circuit 16. Alternatively, the functions of the measurement circuit 14 and the register circuit 16 may be shared by two processors without a strict division between the functions and the processors. Likewise, the functions of the measurement circuit 14 and the register circuit may be shared by three or more processors in meters having extended capabilities.

The memory 20, which may suitably be read-only memory, electrically erasable read-only memory, random access memory, programmable read only memory, or a combination thereof, stores a first set of parameters corresponding to a first metering mode and a second set of parameters corresponding to a second metering mode. All or a part of the memory 20 may be integrally formed with one or more of the processors of the measurement circuit 14 and register circuit 16.

The first metering mode preferably represents a meter functionality or meter definition corresponding to a first user, while the second metering mode preferably represents a meter functionality or meter definition corresponding to a second user. For example, the first metering mode may represent a demand-type meter defined by the utility service provider. A demand meter is a meter that tracks demand in short time intervals during a billing period, and then bills based on the greatest demand for an interval within the billing period. Such billing techniques encourage users to spread their energy usage evenly over the billing period. The second metering mode, by contrast, may represent a meter defined by the customer. For example, the customer may define a load profiling meter, which collects and stores data on energy usage for each time interval within a billing period. The customer may desire to obtain such information to determine how to optimize the customer's energy utilization.

Thus, in the example discussed above, a programmer from the utility could program into the meter 10 a first set of parameters that define a demand metering mode while the user could program into the meter 10 a second set of parameters that define a load profiling meter.

It will be appreciated that the example given above merely illustrates two metering modes that may be configured into the meter 10. It will be appreciated that various metering parameters may be configured to create numerous distinct meter modes.

In particular, the first and second set of parameters include various meter settings, each of which may be customized to define the first and second metering modes. As discussed further below in connection with FIGS. 3–5, the parameters may relate to how various energy values are calculated, which of various energy values are calculated, and which, if any, alarm thresholds are tested.

To this end, the first set of parameters and the second set of parameters may be implemented as structured data tables. It is known in the metering art to use tables to define certain parameters and calibration information. In accordance with the present invention, a set of structured data tables is provided for each metering mode executed by the utility meter 10. Each set of structured data tables has predefined locations for each parameter of the sets of parameters. Accordingly, the data tables for the various sets of parameters are largely uniform in structure. While the table structures are uniform, it is noted that some metering modes may require more tables than other metering modes due to the differences in functionality.

In any event, in the example described herein, the memory 20 includes a set of data tables containing the first set of parameters and a set of data tables containing the second set of parameters.

The processor 18 is operable to generate the first and second metering information by carrying out the operations of the flow diagram 100 of FIG. 2. In particular, in step 105, the processor 18 receives the first and second set of parameters and stores them in the memory 20. To this end, the processor 18 may receive the first and second set of parameters via the communication device 15. It is noted that the processor 18 may receive the first and second set of parameters at separate times. For example, the utility meter 10 may initially be configured for a single metering mode and then, after operating for a certain period of time, a second user may define a second metering mode. Accordingly, step 105 merely represents that at some point, the processor 18 has received and stored in the memory a first and second set of parameters.

In an alternative embodiment, the first and second set of parameters may be stored in the memory 20 without the operation of the processor 18. For example, one or more removable memory chips containing the first and second set of parameters may be installed within the meter. While such an embodiment would still benefit from the concurrent, multiple mode metering advantages of the present invention, it would be less convenient than allowing communication of the sets of parameters through the processor 18 because it requires physical alteration of the utility meter 10.

It will further be appreciated that more than two sets of parameters may be obtained and stored by the processor 18 in step 105. For example, the utility meter 10 may be configured to perform three or more separate metering modes concurrently using three or more sets of parameters. In other words, the utility meter 10 may be configured to perform three, four, or more separate metering modes. To this end, a separate set of parameters should be defined for each metering mode.

In any event, steps 110 through 135 discussed below represent the metering operations that are carried out on a regular, repetitive basis once the sets of parameters have been stored in the memory 20.

In step 110, the processor 18 receives the commodity consumption signals from the measurement circuit 14. As discussed above, the commodity consumption signals include real energy (watts), reactive energy (VARs), volts-squared, and amps-squared for the previous one second in the exemplary embodiment described herein. The processor 18 may store these values in internal registers.

Thereafter, in step 115, the processor 18 sets the current metering mode ("CM") equal to 1. The current metering mode identifies to the processor 18 which of the multiple metering modes is currently active. Once CM is set to 1, the processor 18 proceeds to step 120.

Figure 3:
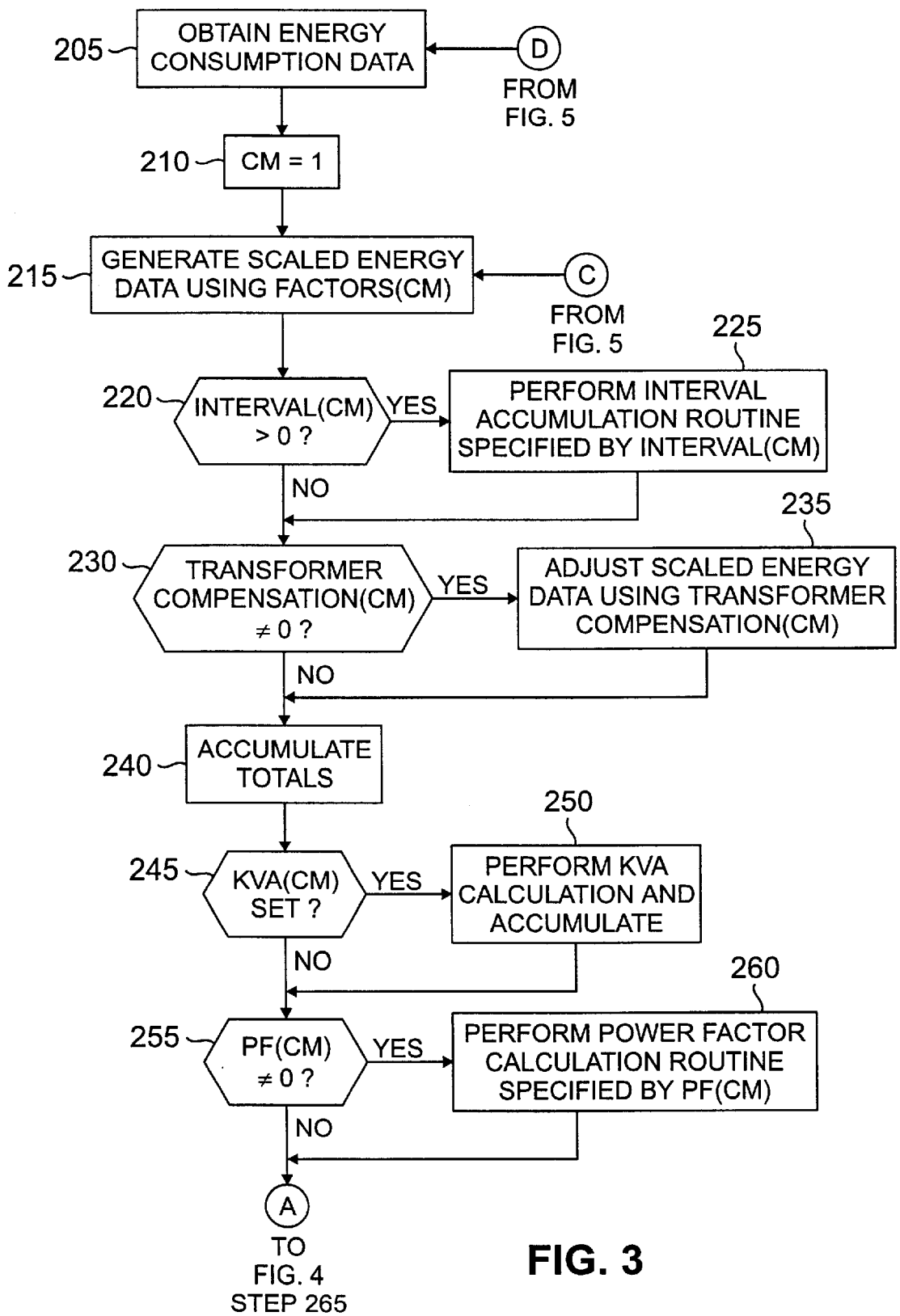
FIGS. 3, 4 and 5 show in further detail an exemplary flow diagram of operations carried out by a processor of a meter according to the present invention.
Figure 4:
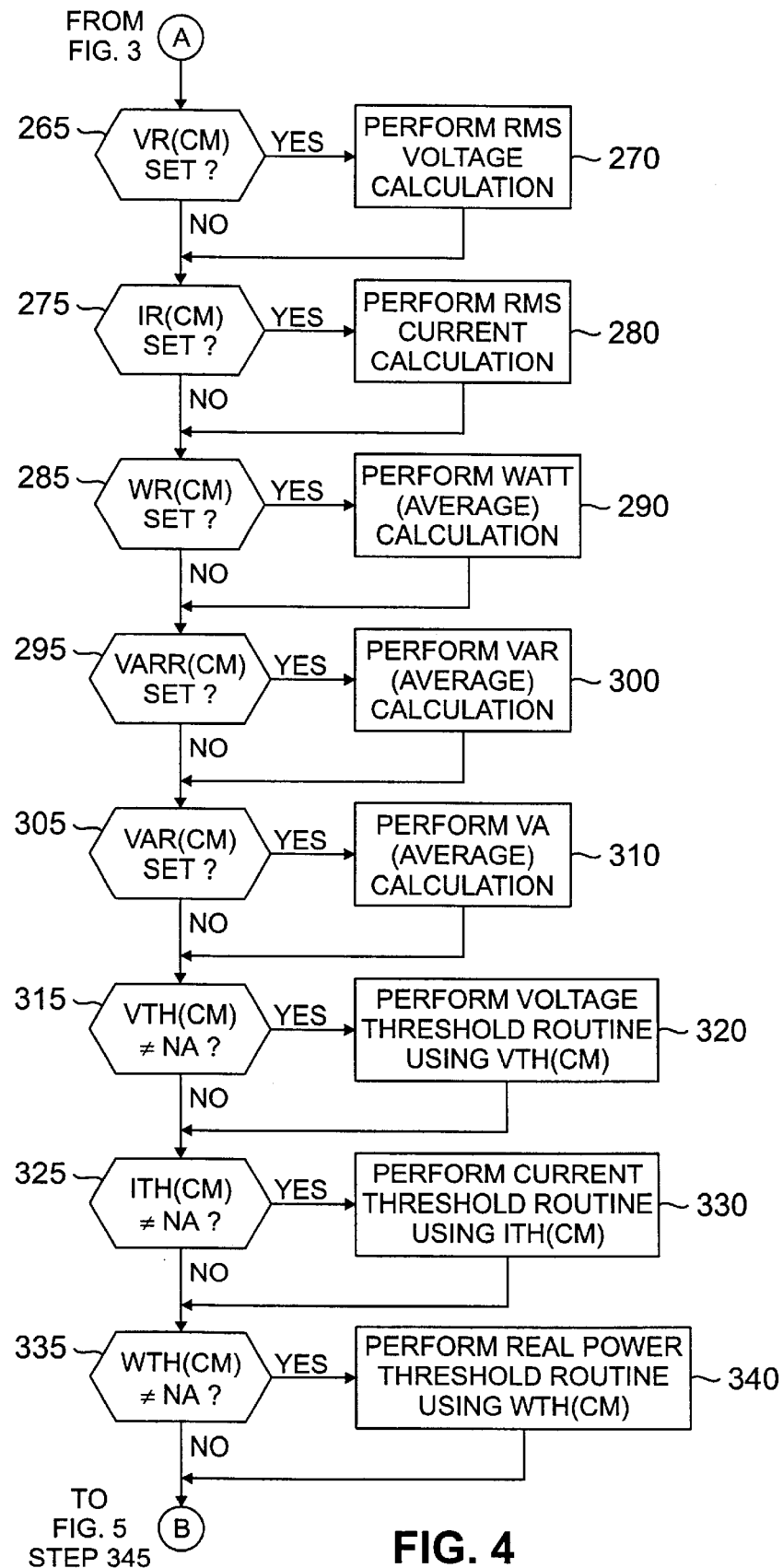
Figure 5:
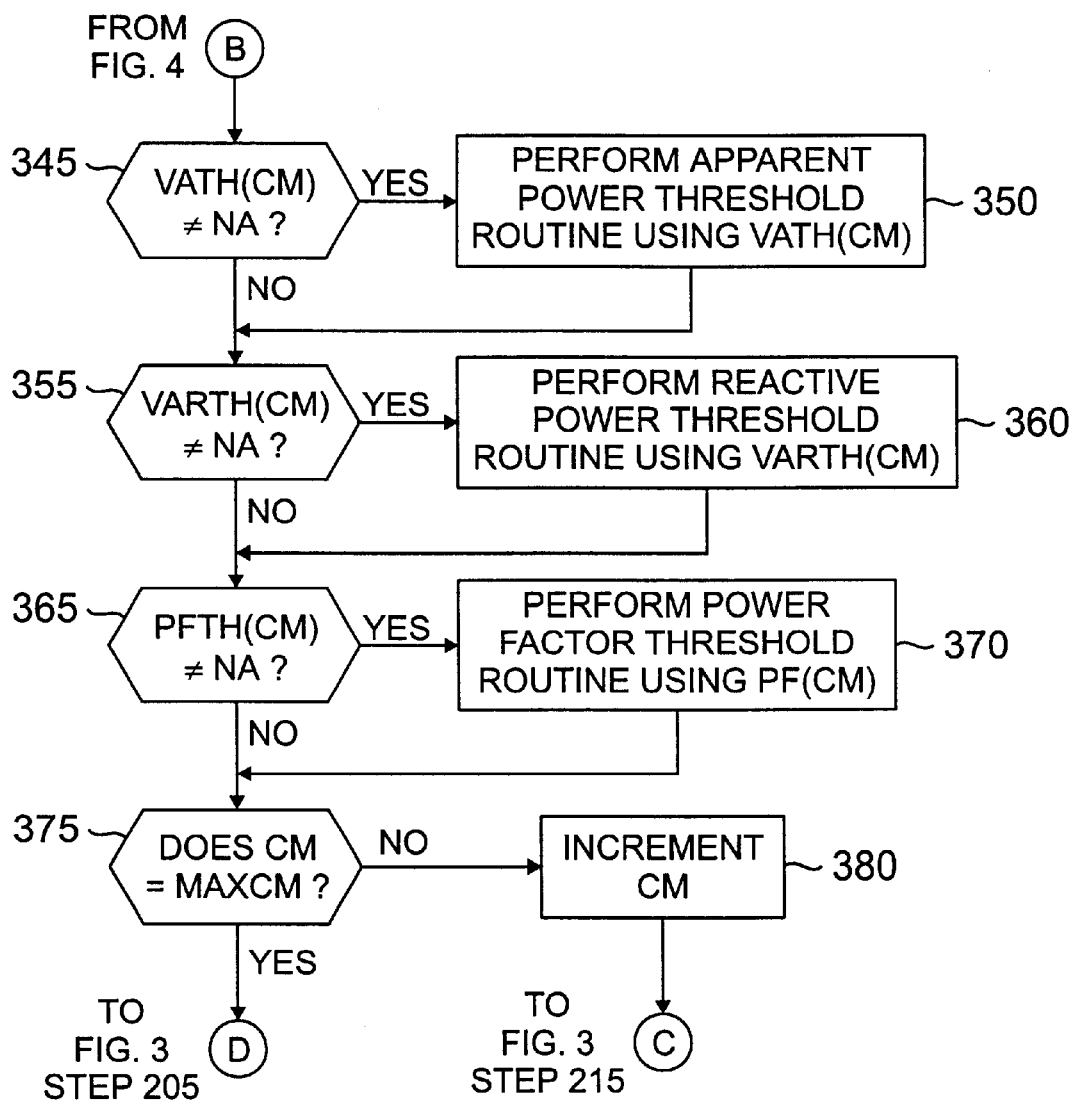

In step 120, the processor performs the metering routine using the set of parameters that corresponds to the current metering mode. Thus, if CM=1, then the processor 18 performs the metering routine using the first set of parameters. Preferably, the metering routine is generic program code that can perform all of the metering modes. Each set of parameters, however, alter how the program code is executed. For example, the first set of parameters may cause certain subroutines in the metering routine to be executed and others not to be executed based upon the functionality defined by the first metering mode. In addition, however, it is noted that in alternative embodiments, the first set of parameters may actually include lines of program code or entire subroutines, thereby increasing the flexibility of the utility meter 10. In any event, the metering routine itself at some level is generic to all of the metering modes. FIGS. 3 through 5, discussed below, show one example of a generic metering routine that is executed in accordance with multiple sets of parameters to define multiple metering modes.

During the execution of step 120, the processor 18 generates metering information corresponding to the current metering mode. For example, the processor 18 may generate accumulated watt-hour information, voltage or current level information, or alarm threshold information in accordance with the relevant set of parameters. Such information is stored in registers within the processor 18 or within the memory 20.

As discussed further below, the stored metering information may subsequently (or concurrently) be displayed on the display 17, communicated to an external or remote device via a communication circuit 15, or a combination of the above.

Thereafter, in step 125, the processor 18 determines whether the current metering mode is the last defined metering mode. Thus, in the exemplary embodiment described herein, the processor 18 determines whether CM=2. If not, then the processor 18 proceeds to step 130 in which the processor 18 increments the current metering mode. Once the current metering mode is incremented in step 130, the processor 18 returns to step 120 to perform the metering routine using the same commodity consumption data but a different set of parameters, in other words, the set of parameters that correspond to the new current metering mode.

It will be noted that while the same commodity consumption data set is used for the different metering modes, the different metering modes may not use the same individual portions of the data. For example, although the commodity consumption data in the embodiment described herein includes energy data, reactive energy data, voltage and current data, the first metering mode may only use the energy data and the second metering mode may only use the reactive energy data. Accordingly, as used herein, the same commodity consumption data merely means commodity consumption data produced by the same measurement circuit for the same time interval or at least overlapping time intervals.

Thus, as contemplated by the present invention, the processor 18 executes a similar core metering routine in step 120 for each of the defined metering modes. For each of the defined metering modes, metering information is generated as discussed above in connection with step 120.

Referring again to step 125, if it is determined that the current metering mode is the last defined metering mode, then the processor 18 returns to step 110 to obtain new commodity consumption data. The processor 18 thereafter proceeds as described above using the new commodity consumption data.

Referring again to FIG. 1 alone, the processor 18 typically further operates in conjunction with the communication circuit 15 to provide metering information for communication to an external device. The communication circuit 15 may be suitably be the communication circuit 55 shown and described in U.S. patent application Ser. No. 09/227,434 or the communication circuit 114 shown and described in U.S. Pat. No. 6,112,158 to Bond et al. In general, the communication circuit 15 is operable to obtain at least some of the metering information from the processor 18 and provide the metering information to an external device, not shown. The external device may suitably be a remote device connected through a communication network, or a portable device that connects directly to the communication circuit 15.

In operation, the processor 18 preferably provides certain metering information to the communication circuit 15 in conjunction with an interrupt. Thus, the processor 18 may perform normal metering operations such as those described above in connection with FIG. 2 until an interrupt is generated. The interrupt may be provided by the communication circuit 15, or by a timer internal to the processor 18. In response to the interrupt, the processor 18 obtains any of the metering information that is requested and provides it to the communication circuit 15.

In the case in which the communication circuit 15 provides the interrupt, the communication circuit 15 may suitably generate an interrupt in response to a communicated request signal from an external device. Thus, for example, if the first user requests the first metering information, the request is communicated to the communication circuit 15 which, in turn, requests the data from the processor 18 via an interrupt.

In the case in which the internal timer generates the interrupt, one or more timers within the processor 18 may be set in accordance with the first and second set of parameters to automatically communicate all or a part of the first and second metering information, respectively. Thus, upon expiration of a particular timer, the processor 18 automatically provides the appropriate metering information to the communication circuit 15.

Thus, the communication circuit 15 and the processor 18 operate in conjunction to communicate all or some of the first set of metering information to a first user and the second set of metering information to the second user. As discussed above, the first and second user may obtain their respective metering information using a specific request, or alternatively, the first and second users may use the first and second set of parameters, respectively, to define automatic, timer-initiated communication of metering information.

The processor 18 also operates in conjunction with the display 17 to display select portions of the first and/or second metering information. The display device 17 may suitably be a liquid crystal display as is commonly used in electricity meters. However, other types of display devices may be employed. In operation, the processor 18 preferably provides information to the display device 17 in response to an interrupt.

In general, it is preferable to display only a subset of one of the sets of metering information. In other words, some or all of either the first metering information or the second metering information would be displayed, but not both. Otherwise, displaying both first and second metering information could conceivably lead to confusion to the meter reader. Thus, the default operation may be to display a select portion of the first metering information. To carry out the default display, the processor 18 may perform an interrupt routine that provides the select metering information to the display device 17 pursuant to a timer-generated interrupt.

In addition the utility meter 10 may include a user interface 19, for example, switches or buttons, not shown, that allow one or more users to scroll the display 17. The user interface 19 would thus generate the display interrupt.

Accordingly, similar to the communication operations, the display operations preferably consist of timer-generated or user-generated interrupt routines that occur during the normal execution of the operations of the flow diagram 100 of FIG. 2. However, it will be appreciated that those of ordinary skill in the art may readily devise their own methods for storing and/or communicating the first and second metering information.

Therefore, the present invention provides a plurality of advantages arising from multiple virtual registering operations which are logically connected to a single measuring operation. Multiple users may define their own unique virtual meters that measure energy consumption in accordance with the individual user's needs without requiring separate physical meters. As discussed above, the operations described above may readily be expanded to more than two metering modes.

FIGS. 3 through 5 show a flow diagram 200 that represents in further detail an exemplary embodiment of steps 115, 120, 125 and 130 of the flow diagram 100 of FIG. 2. It is noted that although the flow diagram 200 suggests a particular sequence of steps, the exact sequence of steps is largely a matter of design choice. Moreover, it is noted that the steps of the flow diagram 200 will typically be interleaved with other real-time operations of the processor 18, not shown, using software techniques that are well known in the art. The real-time operations may relate to various diagnostic, time-keeping and interrupt handling routines which would be known to those of ordinary skill in the art. Moreover, as discussed above, communication and display operations may also be implemented as real-time operations that are interleaved with the steps of the flow diagram 200.

Referring to FIG. 3, the processor 18 first obtains commodity consumption data in the form of energy consumption data in step 205, similar to step 110 of FIG. 2. In the exemplary embodiment described herein, the energy consumption information includes real energy, reactive energy, volts-squared, and amps-squared over the previous second. Other embodiments may include more or less energy consumption information.

Thereafter, in step 210, the processor 18 sets the current meter mode to the first mode, CM=1. The processor 18 then proceeds to step 215. Steps 215 through 370 correspond to step 120 of FIG. 2.

In step 215, the processor 18 generates scaled energy data from the received energy data. In general, the received energy consumption data 18 is in terms of arbitrary units that are compatible with the data processing circuitry within the meter. The processor 18 in step 215 converts the "raw" energy consumption data into standard engineering units, units of billing dollars, or other units of the user's choice.

It should be noted that because the measured real energy and reactive energy data from the energy consumption data is acquired over a period of time (e.g. one second), such energy consumption data is nominally in terms of energy consumption, as opposed to power consumption. The volts-squared and amps-squared information is also accumulated over time, and thus does not represent true measured voltage or current levels.

In any event, to generate the scaled energy data, the processor 18 uses scaling factors specific to the current meter mode. The scaling factors for each mode are stored with the set of parameters for the current meter mode CM under the parameter name factors(CM). Thus, each meter mode may employ its own scaling. The scaled energy data may for example, include data that provides the energy consumption data in standard engineering units such as kilowatt-hours and VAR-hours. It may be preferable to leave the arbitrary volts-squared and amps-squared information unchanged, as such values are not normally necessary for basic metering calculations.

Thereafter, in step 220, the processor 18 determines whether the current meter mode performs any interval accumulations. For example, in demand metering and load profiling both involve accumulating energy consumption data for relatively short intervals. Demand and load profiling intervals typically range from five minutes to sixty minutes. By contrast, a meter that merely accumulates total energy consumption would not require any interval accumulation. To determine whether the current meter mode requires any interval accumulations, the processor 18 in step 220 determines whether the parameter interval(CM)>0. If so, then in step 225 the processor 18 proceeds to accumulate interval totals in accordance with the appropriate interval accumulation type routine that corresponds with the parameter interval(CM).

Thus, in step 225, the processor 18 preferably executes one of a plurality of subroutines that perform a desired type of interval accumulation. One of the subroutines, for example, may perform a demand-type interval accumulation, while another subroutine performs a load-profiling type interval accumulation. As known in the art, one of the primary differences between load profiling and demand interval accumulation routines is the difference in operations of the meter when an interval is completed. When an interval is completed in a demand metering mode, the processor 18 determines whether the accumulated energy information for the just-completed interval is the highest, or one of the highest, for the billing period. If so, then the information is stored. By contrast, when an interval is completed in a load profiling metering mode, the processor 18 always stores energy values for the just-completed interval.

Thus, the metering routine program includes various interval accumulation routines. The processor 18 executes in step 225 that interval accumulation routine which corresponds to the parameter interval(CM). It is noted that suitable implementations of the interval accumulation routines would be known to those of ordinary skill in the art. It is further noted that individual parameters used by the interval accumulation routines will typically be defined within the set of parameters for the each defined meter mode. For example, the first set of parameters may include, for example, a parameter defining that the duration of the demand interval is to be fifteen minutes. In any event, once the processor 18 has completed the appropriate interval accumulation routine in step 225, the processor 18 proceeds to step 230.

Referring back to step 220, if the processor 18 determines that no interval accumulation routines are identified for the current meter mode, or in other words, that CM=0, then the processor 18 proceeds directly to step 230.

In step 230, the processor determines whether the transformer compensation for the current meter mode, transformer compensation(CM), is non-zero. Transformer compensation addresses error introduced by a customer's transformer that is located between the meter and the utility. In particular, some large industrial customers purchase energy at a relatively high voltage, for example, in excess of 10,000 volts, and employ transformers to step down the voltage for use in their facilities. Utilities, however, prefer to meter the low voltage side of the transformer for various reasons. One consequence of metering the low side of the transformer is that the loss introduced by the customer's transformer is not registered by the meter. Thus, in essence, the customer is "consuming" energy that is not being metered. Accordingly, some users may wish to compensate for such transformer loss while others may desire to incorporate the loss (i.e. refrain from compensating) into the energy calculations. Thus, in the embodiment described herein, the user has the option to define whether to compensate, and if so, how much to compensate, for transformer loss. To this end, during definition of the first and/or second set of parameters a user assigns a value zero to the parameter transformer compensation(CM) if no compensation is to occur. If, however, compensation is required, the user may assign the actual compensation factor value to the parameter transformer compensation(CM).

If the processor 18 determines in step 230 that transformer compensation(CM)=0, then the processor 18 proceeds directly to step 240. If, however, transformer compensation (CM)≠0, then the processor 18 proceeds first to step 235. In step 235, the processor 18 adjusts the scaled energy data by the valued defined by transformer compensation(CM). Thereafter, the processor 18 executes step 240.

In step 240, the processor 18 generates a running accumulated total using the scaled energy data. The running accumulated total represents the traditional "meter" information that may be read periodically to obtain the energy consumption for one or more billing periods. In the exemplary embodiment described herein, running totals of real and reactive energy (kilowatt-hours and kVAR-hours) are accumulated. The running totals are stored in registers in the processor 18, stored in the memory 20. As with all metering information generated and stored in the meter 10, the running totals are stored for subsequent use, display and/or communication.

After step 240, the processor 18 in step 245 determines whether the current meter mode also accumulates and/or measures apparent energy or kVA-hrs. To this end, the processor determines whether the parameter kVA (CM) is set to "yes". If so, then the processor 18 in step 250 performs the kVA-hrs calculation (and adds the value to an accumulated total thereof). The kVA-hrs calculation and the accumulated totals may be stored in a register in the processor 18 or the memory 20 further use, communication or display. Various methods of determining kVA-hrs using the available real energy, apparent energy, voltage and current information are known to those of ordinary skill in the art.

It is noted that the kVA (CM) parameter may alternatively consist of a number that corresponds to one of the known kVA calculation methods. In such a case, as was the case with the interval(CM) parameter, the value kVA(CM)=0 may be used to indicate that apparent energy is not determined in the current meter mode CM. Otherwise, if kVA (CM)≠0, then the processor 18 in step 250 would execute the kVA calculation method identified by the kVA(CM) parameter. In such an alternative embodiment, the users of the meter may not only define whether apparent power is calculated, but also define which method is used to calculate apparent power.

In any event, after step 250, the processor 18 executes step 255.

Referring again to step 245, if the processor 18 determines that apparent power is not to be calculated, then the processor 18 proceeds directly to step 255 without first executing step 250.

In step 255, the processor 18 determines whether the current meter mode requires a power factor calculation. Power factor is a measure of the phase angle between the voltage waveform and the current waveform. Power factor provides an indicator of whether the customer load is largely capacitive, largely inductive, or neither. To determine whether a power factor calculation is required, the processor 18 determines whether the parameter PF(CM)≠0.

If so, then the processor 18 in step 260 performs a power factor calculation using a subroutine that corresponds to the parameter PF(CM). Various power factor calculations using the available real energy, apparent energy, voltage information, and current information are known to those of ordinary skill in the art. The calculated power factor may be stored, as per the other metering variables, for subsequent use, display or communication. The processor 18 thereafter proceeds to step 260.

If, however, in step 255, the processor 18 determines that PF(CM)=0, then the processor 18 proceeds directly to step 265 without executing step 260.

In step 265, the processor 18 determines whether the present voltage level (in volts rms) is to be calculated. To this end, the processor 18 determines whether the parameter VR(CM)="yes". If so, then the processor 18 in step 270 converts the raw voltage information within the scaled energy data, which in the present embodiment is in arbitrary volts-squared unit, into standard volts rms information. The volts rms information is then stored for subsequent use, display or communication. The processor 18 then proceeds to step 275. If, however, in step 265 it is determined that the present voltage level is not to be calculated, then the processor 18 proceeds directly to step 275 without first performing step 270.

In step 275, the processor 18 determines whether the present current level is to be calculated. To this end, the processor 18 determines whether the parameter IR(CM)= "yes". If so, then the processor 18 in step 280 converts the raw current information of the scaled energy data, which in the present embodiment is in arbitrary amps-squared units, into standard rms current information. The rms current information is then stored for subsequent use, display or communication. The processor 18 then proceeds to step 285. If, however, in step 275 it is determined that the present voltage level is not to be calculated, then the processor 18 proceeds directly to step 285 without first performing step 280.

In step 285, the processor 18 determines whether the present (average) real power, i.e. watts, is to be calculated. To this end, the processor 18 determines whether the parameter WR(CM)="yes". If so, then the processor 18 in step 290 converts the energy information of the scaled energy data, which in the present embodiment is in kilowatt-hours, into an average power level information. The average power level may be calculated using only the present energy consumption data, or, in the alternative, step 290 may be configured to keep an average power level using information from several seconds, minutes or hours. The average power level is then stored for subsequent use, display or communication. The processor 18 then proceeds to step 295.

If, however, in step 285 it is determined that the present average power consumption level is not to be calculated, then the processor 18 proceeds directly to step 295 without first executing step 290.

In step 295, the processor 18 determines whether the present (average) reactive power, i.e. VARs, is to be calculated. To this end, the processor 18 determines whether the parameter VARR(CM)="yes". If so, then the processor 18 in step 300 converts the reactive energy information of the scaled energy data, which in the present embodiment is in VAR-hours, into an average reactive power level information. As with the average real power level, the average reactive power may be calculated using only the most recent energy consumption data or energy consumption data for a predetermined number of seconds, minutes or hours. The processor 18 then proceeds to step 305.

If, however, in step 295 it is determined that the present reactive power consumption level is not to be calculated, then the processor 18 proceeds directly to step 305 without first executing step 300.

In step 305, the processor 18 determines whether the present (average) apparent power, i.e. VAs, is to be calculated. To this end, the processor 18 determines whether the parameter VAR(CM)="yes". If so, then the processor 18 in step 310 determines the average apparent power using any one of a plurality of methods. For example, the processor 18 may first calculate kVA-hrs for the scaled energy consumption data as described above in connection with step 245. Once kVA-hrs are calculated, the processor 18 may then generate the average kVAs or VAs. The average apparent power information may then be stored for further use, display or communication. The processor 18 then proceeds to step 315.

If, however, in step 305 it is determined that the average apparent power consumption level is not to be calculated, then the processor 18 proceeds directly to step 315 without first executing step 310.

In step 315, the processor 18 determines whether a voltage threshold routine should be performed. The voltage threshold routine determines whether the voltage level (volts rms) falls outside of a predetermined window. Because voltage levels provided by the utility are ordinary constant, any significant variation of the voltage level may indicate a problem. As a result, it is common to monitor for voltage variations. To determine whether a voltage threshold routine should be performed, the processor 18 determines whether a parameter VTH(CM)≠NA. If the parameter VTH(CM)= NA, or not applicable, then the processor 18 proceeds directly to step 325.

If however, the parameter VTH(CM)≠NA, then the processor 18 executes step 320. In general, in step 320, the processor 18 determines whether the measured voltage is within a predetermined percentage of the nominal voltage level for the utility meter. Preferably, the predetermined percentage is provided as the parameter VTH(CM). Thus, for example, the parameter VTH(CM) may equal 0.05, representing that the predetermined percentage is 5% of the nominal voltage. In step 320, the processor 18 may suitably increment one or more alarm counters if the measured voltage is outside the defined window. The alarm counters, similar to other metering information, may be stored in the memory 20 or in registers of the processor 18 for further use, communication or display. After execution of step 320, the processor 18 executes step 325.

In step 325, the processor 18 determines whether a current threshold routine should be performed. The current threshold routine preferably determines whether the current level (amps rms) exceeds a predetermined threshold. As opposed to the voltage level, the current level measured by the utility meter 10 may vary greatly under normal operation. For example, current levels near zero may occur under normal conditions. Accordingly, in contrast to voltage, in which any significant variation could indicate a problem, it is typically only desirable to test for excessive current. To determine whether a current threshold routine should be performed, the processor 18 determines whether a parameter ITH(CM)≠NA. If the parameter ITH(CM)=NA, then the processor 18 proceeds directly to step 335.

If, however, the parameter ITH(CM)≠NA, then the processor 18 first executes step 330. In general, in step 330, the processor 18 determines whether the measured current exceeds a predetermined threshold. Preferably, the predetermined threshold is provided as the parameter ITH(CM). Thus, for example, the parameter ITH(CM) may equal 220, representing that the predetermined threshold is 220 amperes. In step 320, the processor 18 may suitably increment one or more alarm counters if the measured current is in excess of the threshold. The alarm counters, similar to other metering information, may be stored in the memory 20 or in registers of the processor 18 for further use, communication or display. After execution of step 330, the processor 18 executes step 335.

In step 335, the processor 18 determines whether a real power threshold routine should be performed. The real power threshold routine determines whether the real power level (watts) exceeds a predetermine threshold. Customers as well as utilities may find it useful to track the number of times the real power usage exceeds a certain level in order to understand better the customer's energy usage patterns. As a result, it may be useful to determine whether the measured real power exceeds a predetermined threshold. To determine whether a real power threshold routine should be performed, the processor 18 determines whether a parameter WTH(CM)≠NA. If the parameter WTH(CM)=NA, then the processor 18 proceeds directly to step 345.

If, however, the parameter WTH(CM)≠NA, then the processor 18 executes step 340. In general, in step 340, the processor 18 determines whether the current real power level exceeds a threshold defined by WTH(CM). The processor 18 may suitably increment one or more alarm counters if the measured real power exceeds the defined threshold. The alarm counters, as discussed above, may be stored further use, communication or display. After execution of step 340, the processor 18 executes step 345.

In step 345, the processor 18 determines whether an apparent power threshold routine should be performed. The apparent power threshold routine determines whether the apparent power level (VAs) exceeds a predefined threshold. As with real power, customers as well as utilities may find it useful to track the number of times the apparent power usage exceeds a certain level in order to understand better the customer's energy usage patterns. To determine whether an apparent power threshold routine should be performed, the processor 18 determines whether a parameter VATH (CM)≠NA. If the parameter VATH(CM)=NA, then the processor 18 proceeds directly to step 355.

If, however, the parameter VATH(CM)≠NA, then the processor 18 executes step 350. In general, in step 350, the processor 18 determines whether the current apparent power level exceeds a threshold defined by VATH(CM). The processor 18 may suitably increment one or more alarm counters if the measured apparent power exceeds the defined threshold. The alarm counters, as discussed above, may be stored further use, communication or display. After execution of step 350, the processor 18 executes step 355.

In step 355, the processor 18 determines whether a reactive power threshold routine should be performed. The reactive power threshold routine determines whether the reactive power level (VARs) exceeds a predefined threshold. As with real and apparent power, it may be useful to track the number of times the reactive power usage exceeds a certain level. To determine whether the reactive power threshold routine should be performed, the processor 18 determines whether a parameter VARTH(CM)≠NA. If the parameter VARTH(CM)=NA, then the processor 18 proceeds directly to step 365.

If, however, the parameter VARTH(CM)≠NA, then the processor 18 executes step 360. In general, in step 360, the processor 18 determines whether the current reactive power level exceeds a threshold defined by VARTH(CM). The processor 18 may suitably increment one or more alarm counters if the measured reactive power exceeds the defined threshold. The relevant alarm counters, as discussed above, may be stored further use, communication or display. After execution of step 360, the processor 18 executes step 365.

In step 365, the processor 18 determines whether a power factor threshold routine should be performed. The power factor threshold routine determines whether the calculated power factor is within a predefined window of unity. When power factor varies significantly from unity, it can be indicative of inefficient power utilization or inaccurate energy metering. Accordingly, it is sometimes useful to monitor the number of times that the power factor varies from unity by at least a certain amount. To determine whether the power factor threshold routine should be performed, the processor 18 determines whether a parameter PFTH(CM)≠NA. If the parameter PFTH(CM)=NA, then the processor 18 proceeds directly to step 375.

If, however, the parameter PFTH(CM)≠NA, then the processor 18 executes step 370. In general, in step 370, the processor 18 determines whether the current power factor value varies from unity by more than a percentage defined in PFTH(CM) for a certain minimum current level. To this end, the minimum current level may be a parameter IMPF (CM). The processor 18 then determines whether the power factor varies from unity by more than a percentage define by PFTH(CM) and whether the current level exceeds IMPF (CM). The processor 18 may suitably increment one or more alarm counters if both conditions are satisfied The relevant alarm counters, as discussed above, may be stored further use, communication or display. After execution of step 370, the processor 18 executes step 375.

It is noted, however, that like other parameters, the PFTH(CM) parameter may identify a power factor threshold routine instead of simply a threshold value. For example, it is some times desirable to determine whether the power factor exceeds a threshold that varies with the current level. The relationship between power factor threshold and current level may be defined in a routine.

In any event, at step 375, the metering routine is completed for the current meter mode. Thus, in step 375, the processor 18 determines whether the current meter mode CM is equal to the last defined meter mode MAXCM. If so, then the processor 18 returns to step 205 to obtain new energy consumption data and proceeds accordingly. If not, then the processor 18 increments the current meter mode CM in step 380 and then returns to step 215 to repeat the metering routine using the set of parameters for the new meter mode.

As can be seen from the above implementation, the parameters of the various sets of parameters may include among other things, parametric values and selection values. Parametric values are actual numerical values used directly as variables in an energy-related calculation in the metering routine. For example, the VTH(CM), WTH(CM), and VARTH(CM) are parametric values parameters. By contrast, selection values identify a user selection as to whether to execute a certain energy-related calculation, and in some cases, which method of performing the energy-related calculation to utilize. For example, interval(CA), WR(CM) and VARR(CM) are selection value parameters. The inclusion of various types of parameters increases the flexibility of the utility meter 10. However, it is noted several of the advantages of the present invention may be realized without using multiple types of parameters.

It will be appreciated that the above described embodiments of the present invention are merely illustrative, and that those of ordinary skill in the art may readily devise their own implementations that incorporate the principles of the present invention and fall within the spirit and scope thereof.

It is further noted that the present invention is not limited to electrical utility meters, and thus, the present invention may readily be incorporated into other types of electronic utility meters, including gas meters, water meters, or other utility meters. Such utility meters would typically include a source of commodity consumption signals, a measurement circuit, and a register circuit. For example, an electronic water meter may include a source of water consumption signals such as, for example, a flow meter; a measurement circuit which generates water consumption data, such as, for example, gallons of water consumed per second, from the water consumption signals; and a register circuit which generates metering information, such as, for example, cumulative gallons of water consumed.

What is claimed is:

1. A utility meter which provides multiple concurrent registering of commodity consumption data, the utility meter comprising:
   a) a source of commodity consumption signals;
   b) a measurement circuit operably coupled to the source of commodity consumption signals to receive the commodity consumption signals therefrom, the measurement circuit operable to generate commodity consumption data from the commodity consumption signals; and
   c) a register circuit operably coupled to the measurement circuit to receive the commodity consumption data therefrom, the register circuit including a memory storing a first set of parameters corresponding to a first metering mode, and a second set of parameters corresponding to a second metering mode, a processor operable to generate first metering information by performing a metering routine a first time using the first set of parameters and the commodity consumption data, generate second metering information by performing the metering routine a second time using the second set of parameters and the commodity consumption data, and maintain the first metering information and second metering information contemporaneously.

2. The utility meter of claim 1, wherein the source of commodity consumption signals includes at least one source of electrical energy consumption signals.

3. The utility meter of claim 2, further comprising a display device operably coupled to the processor to receive first metering information therefrom, the display device operable to display at least a part of the first metering information.

4. The utility meter of claim 3, wherein the display is further operably coupled to the processor to receive second metering information therefrom, the display device operable to display at least a part of the second metering information.

5. The utility meter of claim 1, wherein:

the first set of parameters comprises a first set of tables having a predefined configuration, the first set of tables populated by data representative of the first set of parameters; and the second set of parameters comprises a second set of tables having the predefined configuration, the second set of tables populated by data representative of the second set of parameters.

6. The utility meter of claim 1, wherein the first set of parameters includes one or more user-defined values implemented within an energy-related calculation in the metering routine.

7. The utility meter of claim 1, wherein the first set of parameters includes one or more user-defined preferences regarding whether a particular metering calculation in the metering routine should be performed.

8. The utility meter of claim 1, further comprising a communication circuit operably coupled to the processor to receive first metering information therefrom, the communication circuit operable to effectuate communication of at least a part of the first metering information to a remote device.

9. The utility meter of claim 1, wherein the communication circuit is further operably coupled to the processor to receive second metering information therefrom, the communication circuit operable to effectuate communication of at least a part of the second metering information to the remote device.

10. The utility meter of claim 1, wherein the source of commodity consumption signals includes a voltage sensor and a current sensor.

11. The utility meter of claim 1, wherein the measurement circuit includes a digital signal processor.

12. The utility meter of claim 1 wherein the processor is further operable to generate the first metering information and the second metering information using the same commodity consumption data.

* * * * *